United States Patent [19]

Mc Adoo et al.

[11] Patent Number: 5,451,769
[45] Date of Patent: Sep. 19, 1995

[54] CIRCULAR ELECTRODE GEOMETRY METAL-SEMICONDUCTOR-METAL PHOTODETECTORS

[75] Inventors: James A. Mc Adoo, Hampton; Elias Towe; William L. Bishop, both of Charlottesville; Liang-Guo Wang, Hampton, all of Va.

[73] Assignee: The United States of America as represented by the Administrator of the National Aeronautics and Space Administration, Washington, D.C.

[21] Appl. No.: 179,598

[22] Filed: Jan. 5, 1994

[51] Int. Cl.⁶ .............................................. H01J 40/14
[52] U.S. Cl. ..................... 250/214.1; 257/457; 257/459
[58] Field of Search ............... 250/214.1, 214 PR; 257/449, 465, 457, 459

[56] References Cited

U.S. PATENT DOCUMENTS

| | | | |
|---|---|---|---|
| 2,668,184 | 2/1954 | Taylor et al. | 136/89 |
| 2,897,421 | 7/1959 | Kruper | 317/235 |
| 2,898,525 | 8/1959 | Jacobs | 317/124 |
| 3,440,427 | 4/1969 | Kammer | 250/210 |
| 3,622,844 | 11/1971 | Barelli et al. | 317/234 |
| 4,593,304 | 6/1986 | Slayman et al. | 357/30 |
| 4,626,884 | 12/1986 | Shannon | 357/30 |
| 4,807,006 | 2/1989 | Rogers et al. | 357/30 |
| 4,999,695 | 3/1991 | Shiba | 357/30 |
| 5,045,681 | 9/1991 | Elrid et al. | 250/213 |
| 5,214,275 | 5/1993 | Freeman et al. | 250/208.4 |
| 5,222,162 | 6/1993 | Yap et al. | 385/14 |
| 5,222,175 | 6/1993 | Tatoh | 385/93 |

*Primary Examiner*—David C. Nelms
*Assistant Examiner*—Steven L. Nichols
*Attorney, Agent, or Firm*—Linda B. B. Blackburn; George F. Helfrich

[57] ABSTRACT

A high speed, metal-semiconductor-metal photodetector includes a pair of generally circular, electrically conductive electrodes formed on an optically active semiconductor layer. Various embodiments of the invention include a spiral, intercoiled electrode geometry and an electrode geometry having substantially circular, concentric electrodes which are interposed. These electrode geometries result in photodetectors with lower capacitances, dark currents and lower inductance which reduces the ringing seen in the optical pulse response.

9 Claims, 4 Drawing Sheets

CIRCULAR ELECTRODE GEOMETRY METAL-SEMICONDUCTOR-METAL PHOTODETECTORS

ORIGIN OF THE INVENTION

The invention described herein was jointly made by an employee of the United States Government, an employee of the College of William and Mary, an employee of the University of Virginia, and during the performance of work by an employee working under NASA Grant No. NAG-1-1434. In accordance with 35 U.S.C. 202, the contractor elected not to retain title.

BACKGROUND OF THE INVENTION

1. Field of the Invention

The present invention relates generally to photodetectors and more particularly to high speed metal-semiconductor-metal photodetectors with increased signal-to-noise ratios and data transmission rates for use in optoelectronic integrated circuits.

2. Description of the Related Art

High speed, metal-semiconductor-metal (MSM) photodetectors operating at speeds of 1 GHz and above have a wide range of uses in optoelectronic integrated circuits (OEICs). Of particular relevance is the application to optically based telecommunications systems. An illustration of an MSM photodetector representing the current state-of-the-art is shown in FIG. 1. This device consists of a generally rectangular array of interdigitated electrodes 10 deposited on an optically active layer of semiconductor material 20, typically GaAs or InGaAs. Usually the electrodes are chosen to form Schottky contacts at the electrode-semiconductor interface, but ohmic contacts have occasionally been used. Incident radiation is absorbed between the electrodes, which are connected such that every other electrode is at an opposite electrostatic potential. The electron-hole pairs produced in the semiconductor layer by the absorbed photons are transported to the electrodes by the strong electric fields produced by the bias voltage and then constitute a signal current.

The planar structure of the MSM photodetector results in lower capacitances for these devices than for any of the doped junction photodetectors (e.g., PN or PIN diodes). This improves the limitations on speed imposed by interaction of the device with the circuit into which it is embedded. The electrode finger width can be made extremely small to allow very fast transit-times of the photogenerated carriers, which is the other limiting factor in determining the overall system response time. Finally, the fabrication technology for these devices is fully compatible for that used in field-effect transistors, making these devices easy to integrate into monolithic high-speed fiber-optic receiver circuits.

In spite of these advantages, the rectangular, interdigitated electrode geometry currently used in MSM photodetectors has several disadvantages. First, the abrupt termination of the electrode fingers results in a non-ideal electrostatic distribution characterized by "crowding" of electric field lines in the regions near the ends of the electrodes. This can manifest itself in an increased capacitance and degraded dark current performance.

Secondly, the shape of this device is not well matched for interaction with optical signal sources. Most optical sources such as lasers and LEDs produce an intensity distribution that is circular in nature. The rectangular shape of the interdigitated, electrode geometry, MSM photodetectors is therefore not matched to these sources. This presents an unfavorable trade-off between signal-to-noise ratio and signal bandwidth. In order to fully detect an optical signal in this situation, the detector must be made with the length and width of the active area equal to the beam diameter, where the active area is defined as the area of the semiconductor layer exposed to incident radiation. This results in excess device area that is not used in the detection process but which still contributes to the device capacitance. The increased capacitance will result in a less than optimal signal bandwidth. Conversely, decreasing the active area of the detector to reduce capacitance, and thus increase bandwidth, results in a detector size smaller than that of the optical beam, degrading the signal-to-noise ratio.

SUMMARY OF THE INVENTION

An object of the present invention is to provide a photodetector in which the electrode lowers the capacitance and dark current in the device.

A further object of the present invention is to provide a photodetector in which the electrode reduces the inductance of the device and reduces the ringing seen in the optical pulse response.

A further object of the present invention is to provide a photodetector with an electrode which reduces crowding of electrostatic field lines associated with abrupt terminations of of portions of the electrodes.

The foregoing and additional objects are obtained by a photodector according to the present invention for use in optoelectric circuits. Instead of the rectangular, interdigitated electrode geometry of FIG. 1, the present invention has electrodes which are generally circular or spiral. The device is comprised of two electrically conductive electrodes disposed on an optically active semiconductor layer such that the electrodes do not entirely block incident radiation from reaching the surface of the semiconductor layer. The ratio of the device area covered by the metal electrodes to the total active device area is referred to as the fill factor and this ratio may be varied according to methods well known by those of ordinary skill in the art. Materials for the semiconductor layer and the electrodes are selected based on their ability to form Schottky contacts or ohmic contacts at the semiconductor-electrode interface.

The electrodes are biased to alternating potentials by an external voltage source. Incident radiation striking the semiconductor layer creates electron-hole pairs in the semiconductor material by absorption of photons which are then collected by the electrodes to produce the signal current.

In the preferred embodiment of the present invention, each electrode is substantially spiral and lies essentially parallel to the other electrode, FIG. 2. Because each spiral terminates at only one end within the spiral, crowding of the electrostatic field lines only occurs at this one terminal point. This is a significant reduction in crowding compared to the numerous locations of crowding that are associated with the fingers of a rectangular array of interdigitated electrodes. The end of each electrode which terminates outside the spiral may be attached to a bonding pad or another device as part of a circuit or more complicated system. This geometry spiral optimizes the correlation between the photodetector shape and the shape of the optical beam, and has the added advantage of reducing the inductance of the device, when compared to the rectangular electrode array, as a result of the opposing direction of current flow through the two arms of the spiral. This lowered inductance results in a reduction of ringing seen in the optical pulse response. The spiral geometry also results in lower capacitance and dark current.

In an alternate embodiment illustrated in FIG. 3, lower capacitances have been obtained when compared to conventional, rectangular electrode arrays. In this embodiment, each electrode has a number of substantially circular, concentric branches and the branches of each electrode are interposed without contacting each other. The circular electrodes are not fully closed, forming a split-ring structure, in order to accommodate the interconnect structure for each electrode needed to provide the proper bias potential and carry the signal current to an external circuit.

Located within the concentric rings of the circular electrode structure is a central disk. If this disk were absent, carriers generated in the central region would encounter very low electric fields and be very slowly transported to the innermost electrode. The result would be a significant degradation of the response time. The split-ring type structure for the electrodes is easiest to fabricate, however, other embodiments, such as closed rings with a multilayer dielectric isolation containing via holes for the interconnect structure, as illustrated in FIG. 4, are possible.

Although MSM photodetectors are typically fabricated using materials such as GaAs or InGaAs as the optically active semiconductor material, any other material can be used on which can be formed patterned electrodes that exhibit rectifying behavior (i.e., Schottky contacts) or non-rectifying behavior (i.e., ohmic contacts) and which absorb light in a desired wavelength. Such materials may include Si, SiC, AlGaAs, AlN, GaN, AlGaN, BN, ZnSe and HgCdTe. In like manner, any electrically conductive material that is capable of forming Schottky contacts or ohmic contacts with the semiconductor layer may be used for the electrodes. Some typical metalization schemes which are commonly used include Ti/Au, Ti/Pt/Au, Al, Cr/Au, Ni/Au, Pt/Au, W/Au and Ag.

DESCRIPTION OF THE PREFERRED EMBODIMENTS

Figure 1:
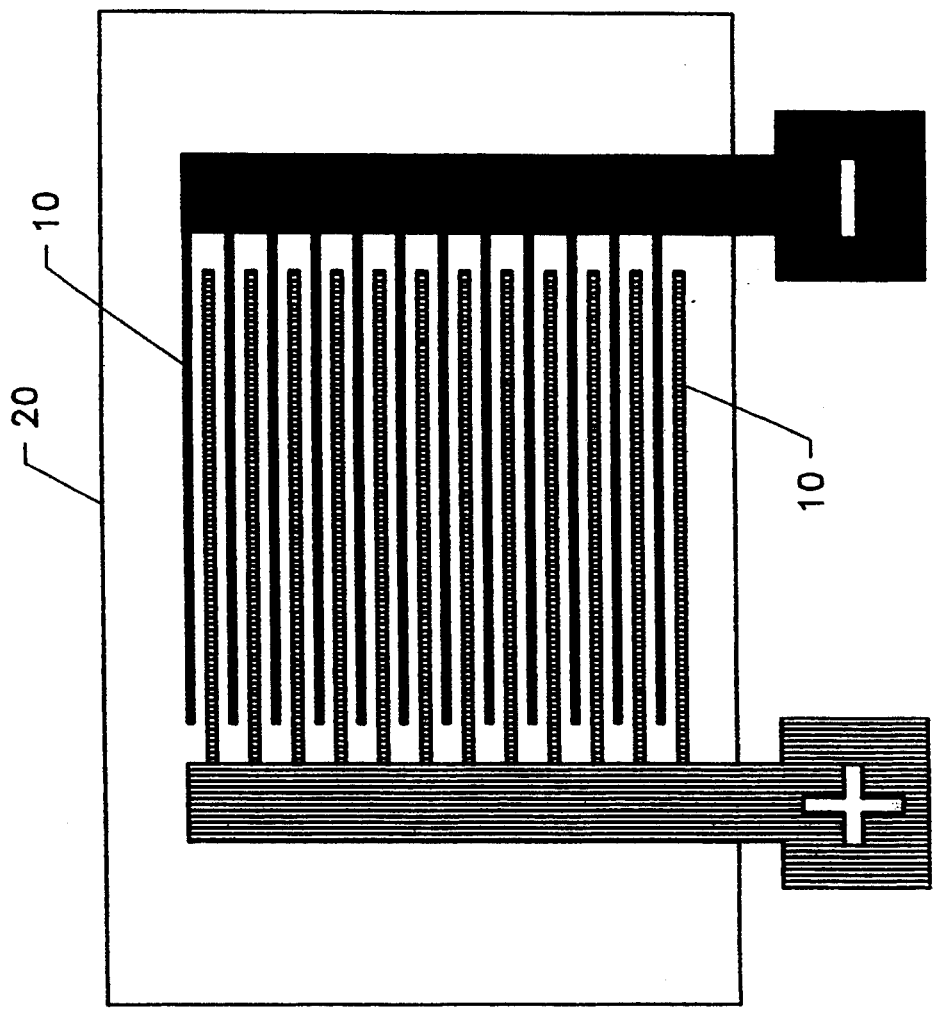
FIG. 1 is a plan view of a conventional, rectangular array of interdigitated electrodes.
Figure 2:
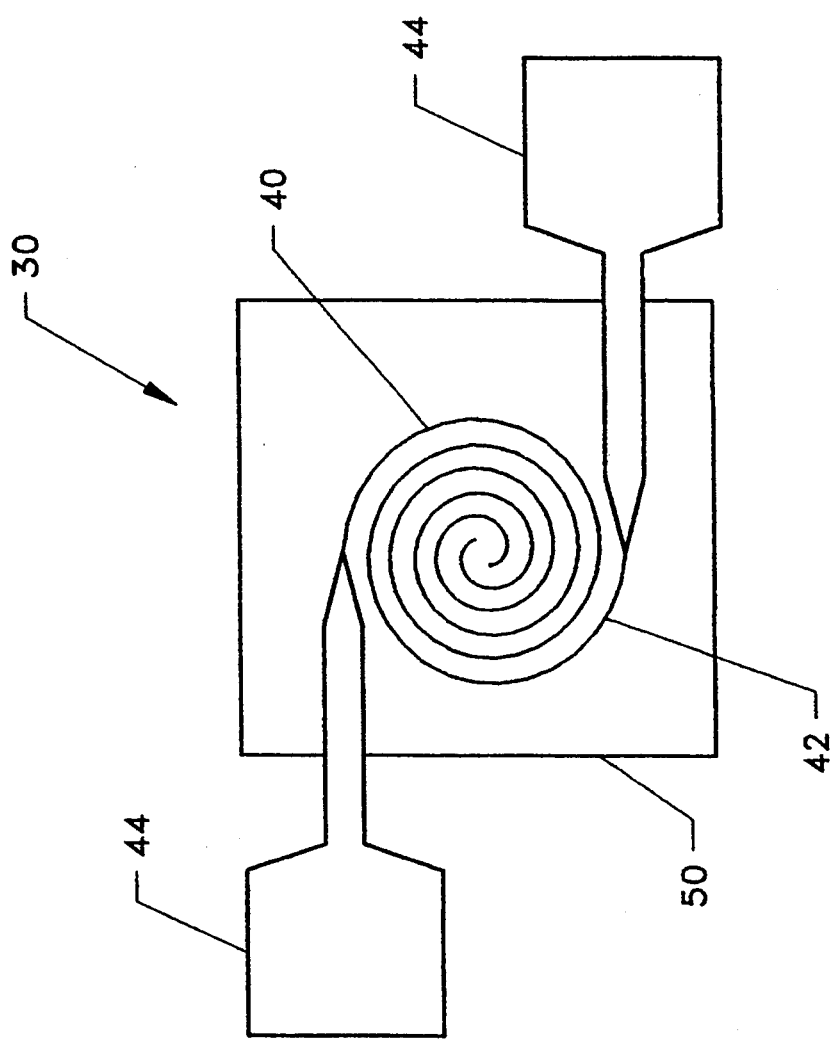
FIG. 2 is a plan view of a photodetector according to one embodiment of the present invention.

Referring now to FIG. 2, the preferred embodiment of a photodetector 30 according to the present invention is shown. This device consists two spiral electrodes 40 and 42 disposed on the surface of a layer of optically active semiconductor material 50. Any material can be used for the semiconductor on which can be formed patterned electrodes that exhibit rectifying behavior (i.e., Schottky contacts) or nonrectifying behavior (i.e., ohmic contacts) and which absorb light in a desired wavelength. Such materials may include GaAs, InGaAs, Si, SiC, AlGaAs, AlN, GaN, AlGaN, BN, ZnSe and HgCdTe. The electrodes can be any electrically conductive material which can be formed into patterned electrodes and which are capable of forming Schottky contacts or ohmic contacts with the semiconductor material. Typical metalization schemes which are commonly used for electrodes include Ti/Au, Ti/Pt/Au, Al, Cr/Au, Ni/Au, Pt/Au/W/Au and Ag.

For convenience of illustration, the semiconductor layer is represented as a rectangular area slightly larger than the area covered by the electrode pattern. It is understood by those of ordinary skill in the art, however, that the semiconductor layer can actually be much larger than the area covered by the electrode pattern. The only limitation on the size of the semiconductor layer is that the semiconductor layer can not have an area that is less than that spanned by the electrode pattern. This semiconductor layer can be a simple active layer, as depicted in the enclosed figures, or any of a number of appropriate heterostructures that are well known in the art.

These spiral electrodes 40 and 42 turn in the same direction and are parallel to each other for the entire length of the spiral, resulting in interpositioning of one spiral electrode within the spiral of the other electrode. The space between spiral electrodes is maintained essentially constant and the two electrodes are not in contact with each other at any point along their length. The end of each electrode that extends beyond the spiral connects to a bonding pad 44 or other device as part of a circuit or more complicated optoelectronic system. Any suitable external voltage source (not shown) may be used to bias the electrodes.

Figure 3:
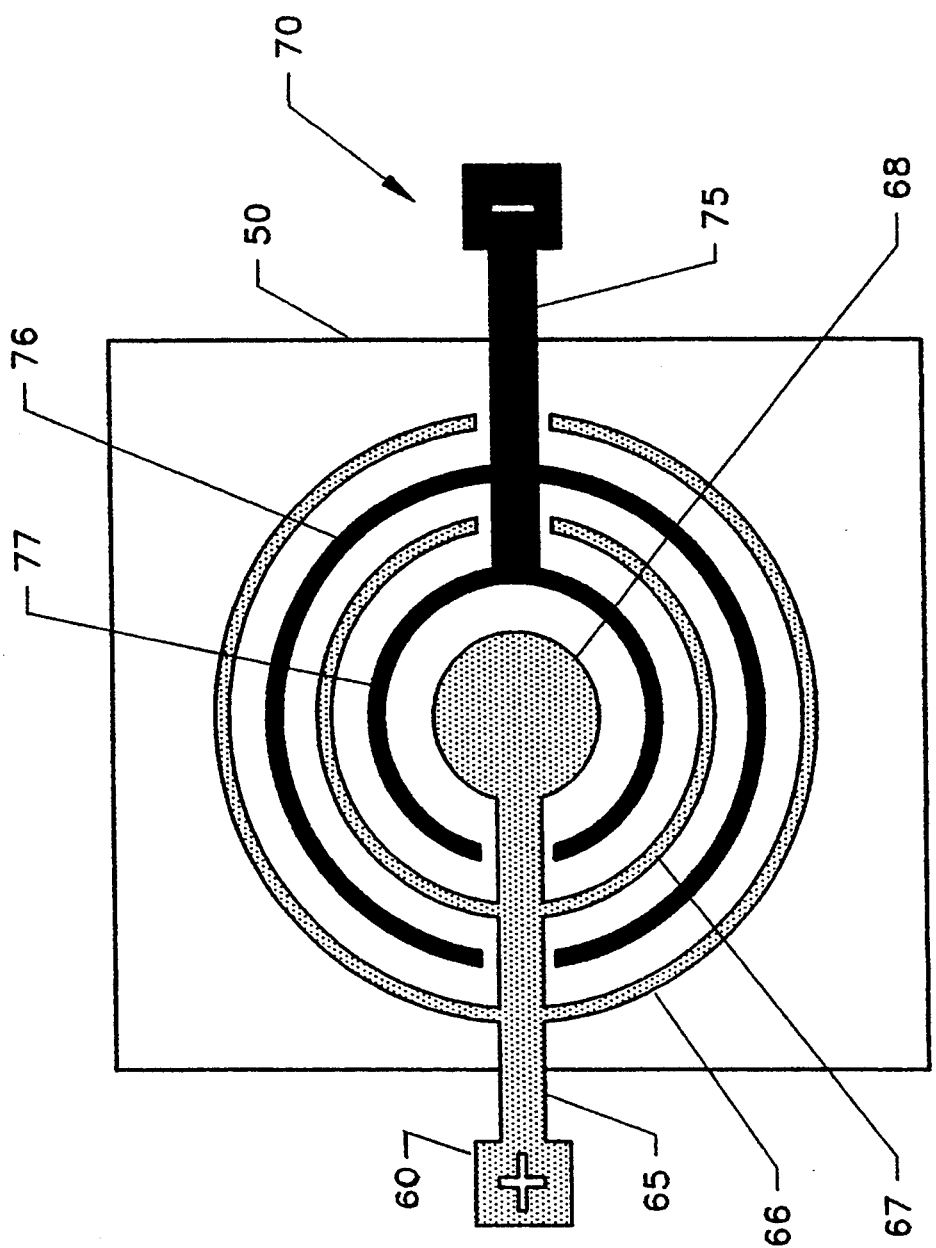
FIG. 3 is a plan view of a second embodiment of the present invention.

In the alternate embodiment shown in FIG. 3, a first electrode 60 is disposed on the surface of an optically active semiconductor material 50 and is comprised of a first element 65 which intersects a plurality of substantially circular second elements 66 and 67. The area of the semiconductor and the semiconductor material may vary as discussed in reference to FIG. 2, above. Each of these circular elements 66 and 67 are concentric with respect to each other and are open at a point approximately 180 degrees from the point of intersection with the first element of the first electrode 65, creating the appearance of split rings. The first element 65 is connected to a central disk 68 which is located at the approximate center of the concentric circular elements 66 and 67.

A second electrode 70 is also disposed on the surface of the semiconductor layer 50 and has a first element 75 that is similar to element 65 of the first electrode 60. This element 75 lies within the openings created by the split rings in the concentric second elements of the first electrode 66 and 67. A plurality of substantially circular second elements 76 and 77 intersect the first element 75. These second elements 76 and 77 are essentially concentric with the second elements of the first electrode 66 and 67 and are disposed such that the second elements of the second electrode 76 and 77 alternate with the second elements of the first electrode 66 and 67. These second elements of the second electrode 76 and 77 are also split where they would otherwise intersect the first element of the first electrode 65. The split ends of these second 76 and 77 elements terminate at a space apart from the first element of the first electrode 65. Unlike the first electrode 60, the first element of the second electrode 75 terminates at an intersecting second element 77 rather than at a circular disk.

Any material can be used for the semiconductor on which can be formed patterned electrodes that exhibit rectifying behavior (i.e., Schottky contacts) or non-rectifying behavior (i.e., ohmic contacts) and which absorb light in a desired wavelength. Such materials may include GaAs, InGaAs, Si, SiC, AlGaAs, AlN, GaN, AlGaN, BN, ZnSe and HgCdTe. The electrodes can be any electrically conductive material which can be formed into patterned electrodes and which are capable of forming Schottky contacts or ohmic contacts with the semiconductor material. Typical metalization schemes which are commonly used for electrodes include Ti/Au, Ti/Pt/Au, Al, Cr/Au, Ni/Au, Pt/Au/W/Au and Ag.

Figure 4A:
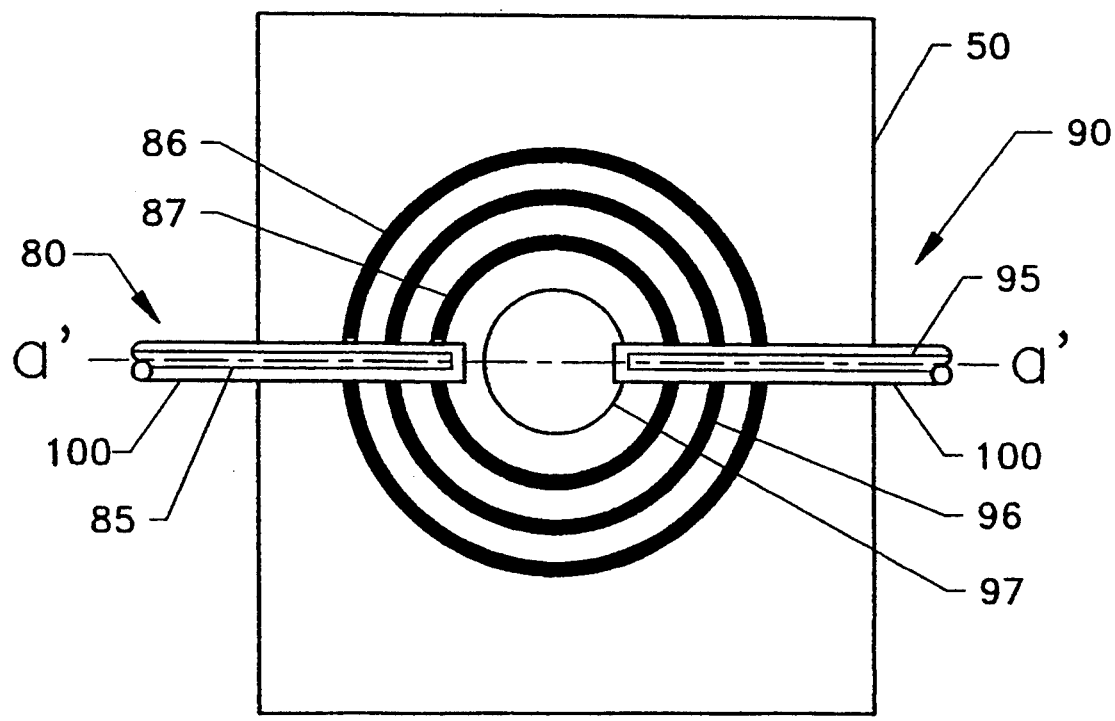
FIG. 4(a) is a plan view of a third embodiment of the present invention.
Figure 4B:
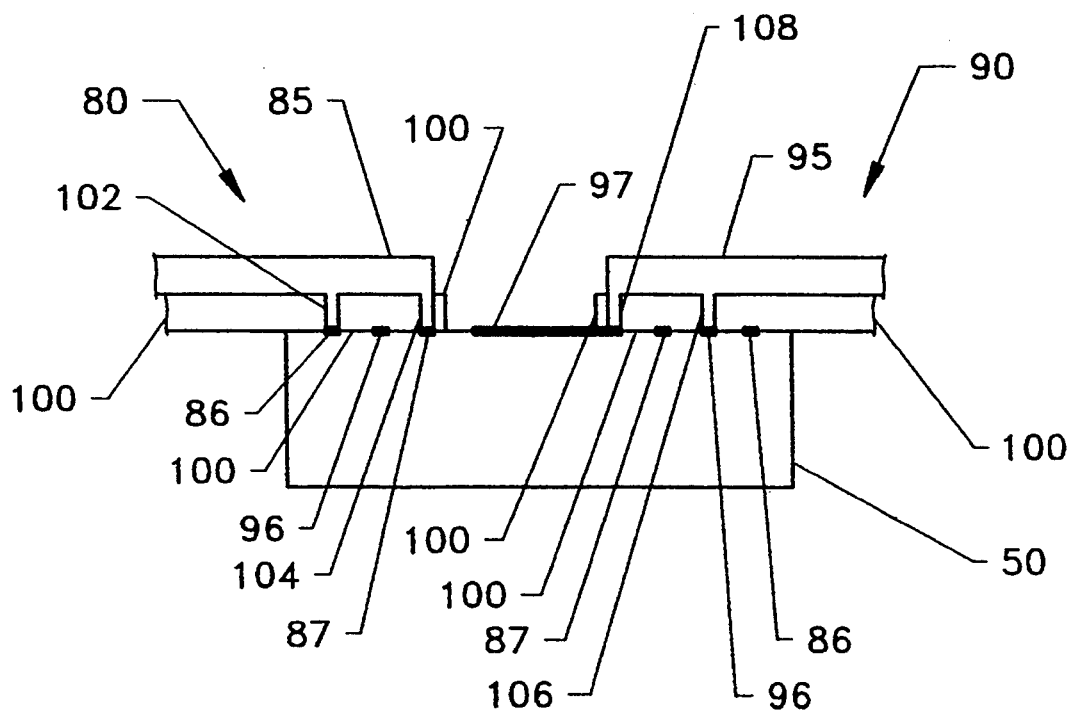
FIG. 4(b) is a cross-sectional view of the embodiment shown in FIG. 4(a), taken along the line a–a'.

In the alternate embodiment illustrated in FIGS. 4(*a*) and 4(*b*), a first electrode 80 is comprised of a first element 85 which is connected to a plurality of substantially circular second elements 86 and 87. The second elements 86 and 87 are disposed on an optically active semiconductor layer 50. Each of these second elements 86 and 87 are closed circles and concentric with each other.

A second electrode 90 is comprised of a first element 95 which is connected to a plurality of substantially circular second elements 96 and 97. The second elements 96 and 97 are disposed on an optically active semiconductor layer 50. Each of these second elements 96 and 97 are closed circles and concentric with each other and with the second elements of the first electrode 86 and 87.

A layer of suitable dielectric isolation material 100, such as SiO2, is disposed on the semiconductor surface to a thickness sufficient to completely cover the second elements of the first electrode 86 and 87 and the second elements of the second electrode 96 and 97 and to provide adequate insulative properties. The first element of the first electrode 85 lies on the surface of the isolation layer 100 and connects to each of the second elements of the first electrode 86 and 87 through small holes 102 and 104 positioned above the second elements 86 and 87 and extending through the isolation layer 100. The first element of the second electrode 95 also lies on the surface of the isolation layer 100 and connects to each of the second elements of the second electrode 96 and 97 through small holes 106 and 108 positioned above the second elements 96 and 97 and extending through the isolation layer 100. In addition to dielectric isolation schemes, it is possible to substitute an air bridge for the isolation material.

Any material can be used for the semiconductor on which can be formed patterned electrodes that exhibit rectifying behavior (i.e., Schottky contacts) or non-rectifying behavior (i.e., ohmic contacts) and which absorb light in a desired wavelength. Such materials may include GaAs, InGaAs, Si, SiC, AlGaAs, AlN, GaN, AlGaN, BN, ZnSe and HgCdTe. The electrodes can be any electrically conductive material which can be formed into patterned electrodes and which are capable of forming Schottky contacts or ohmic contacts with the semiconductor material. Typical metalization schemes which are commonly used for electrodes include Ti/Au, Ti/Pt/Au, Al, Cr/Au, Ni/Au, Pt/Au/W/Au and Ag.

Many modifications, improvements and substitutions will be apparent to one skilled in the art without departing from the spirit and scope of the present invention as described herein and defined in the following claims.

What is claimed is:

1. A high speed photodetector responsive to incident optical radiation comprising:
   (a) a layer of optically active semiconductor material;
   (b) a first substantially spiral electrode having an electrically conductive element formed on a portion of the surface of the semiconductor material;
   (c) a second substantially spiral electrode having an electrically conductive element formed on a portion of the surface of the semiconductor material, wherein the direction of the spiral of the second electrode is the same as the direction of the spiral of the first electrode, the second electrode lying substantially parallel and spaced apart from the first electrode such that the spirals of each electrode are intercoiled;
   (d) means for applying bias voltage between the first and second electrodes.

2. A photodetector according to claim 1 wherein each of the electrodes form Schottky contacts with the semiconductor layer.

3. A photodetector according to claim 1 wherein each of the electrodes comprise a metal.

4. A high speed photodetector responsive to incident optical radiation comprising:
   (a) a layer of optically active semiconductor material;
   (b) a first substantially circular electrode having an electrically conductive element formed on a portion of the surface of the semiconductor material, said first electrode comprising further substantially circular, electrically conductive elements, wherein each of the circular elements has a gap in their circumference, the element and the said further elements of the first electrode constituting a first plurality of elements;
   (c) a second substantially circular electrode having an electrically conductive element formed on a portion of the surface of the semiconductor material, said second electrode comprising further substantially circular, electrically conductive elements, wherein each of the circular elements has a gap in their circumference, the element and the further elements of the second electrode constituting a second plurality of elements, the first plurality of elements being interposed within the gaps of the second plurality of elements and being spaced apart from the second plurality of elements;
   (d) means for applying bias voltage between the first and second electrodes.

5. A photodetector according to claim 4 wherein each of the electrodes form Schottky contacts with the semiconductor layer.

6. A photodetector according to claim 4 wherein each of the electrodes comprise a metal.

7. A high speed photodetector responsive to incident optical radiation comprising:
   (a) a layer of optically active semiconductor material;
   (b) a first substantially circular electrode having substantially circular, electrically conductive first elements formed on a portion of the surface of the semiconductor material, wherein each of the first elements are concentric and spaced apart from each other,
   said first electrode further comprising an electrically conductive second element, the second element being spaced a distance above the semiconductor layer and the first elements, wherein the second element is connected to the first elements at points at which the second element passes over each of the first elements;

(c) a second substantially circular electrode having substantially circular, electrically conductive first elements formed on a portion of the surface of the semiconductor material, wherein the first elements are concentric and spaced apart from each other, the first elements of the second electrode being alternately disposed with the first elements of the first electrode, said second electrode further comprising an electrically conductive second element, the second element being spaced a distance above the semiconductor layer and the first elements, wherein the second element is connected to the first elements at points at which the lower surface of each second element passes over each of the first elements;

(d) a layer of dielectric isolation material formed on a portion of the surface of the semiconductor layer, wherein the isolation material is in contact with the lower surface of each of the second elements of the first and second electrodes, the isolation material having holes to accommodate the connections between the first and second elements of each electrode;

(e) means for applying bias voltage between the first and second electrodes.

8. A photodetector according to claim 7 wherein each of the electrodes form Schottky contacts with the semiconductor layer.

9. A photodetector according to claim 7 wherein each of the electrodes comprise a metal.

* * * * *